United States Patent
Yan (10) Patent No.: US 8,730,217 B2
(45) Date of Patent: May 20, 2014

(54) DISPLAY PANEL WITH TWO DISPLAY DIRECTIONS OPPOSITE TO EACH OTHER, ELECTRONIC DEVICE AND METHOD FOR SWITCHING ELECTRONIC DEVICE

(75) Inventor: Hua-Sheng Yan, Hsin-Chu (TW)

(73) Assignees: Au Optronics (Xiamen) Corporation, Xiamen (CN); Au Optronics Corp., Hsin-Chu (TW)

( * ) Notice: Subject to any disclaimer, the term of this patent is extended or adjusted under 35 U.S.C. 154(b) by 124 days.

(21) Appl. No.: 13/421,960

(22) Filed: Mar. 16, 2012

(65) Prior Publication Data

US 2012/0293428 A1 Nov. 22, 2012

(30) Foreign Application Priority Data

May 20, 2011 (CN) .......................... 2011 1 0132888

(51) Int. Cl.
*G09G 3/36* (2006.01)
*G06F 3/041* (2006.01)
*G06F 3/038* (2013.01)

(52) U.S. Cl.
USPC .............................. 345/204; 345/173; 345/98

(58) Field of Classification Search
USPC .................... 345/76, 78, 173, 204; 315/169.3
See application file for complete search history.

(56) References Cited

U.S. PATENT DOCUMENTS 6,714,268 B2 3/2004 Wang et al.
7,599,025 B2 * 10/2009 Yeh et al. ...................... 349/114
2002/0149576 A1 * 10/2002 Tanaka et al. ................. 345/204
2011/0163980 A1 * 7/2011 Kwon et al. .................. 345/173
2012/0098810 A1 4/2012 Nieh et al.

FOREIGN PATENT DOCUMENTS

| CN | 101707028 A | 5/2010 |
| CN | 102005182 A | 4/2011 |
| TW | 200732733 | 9/2007 |

OTHER PUBLICATIONS

China Intellectual Property Office, Office Action issued on Apr. 26, 2013.

* cited by examiner

*Primary Examiner* — Joseph Feild
*Assistant Examiner* — Andrew Sasinowski
(74) *Attorney, Agent, or Firm* — WPAT, PC; Justin King (57) ABSTRACT

A display panel with two display directions opposite to each other, an electronic device and a method for switching the electronic device are provided. The display panel comprises a substrate, a first switching element, a second switching element, and a light-emitting diode. The first switching element is coupled to a scan line and a data line. The second switching element is coupled to a power source. The light-emitting diode is coupled to the second switching element and another power source. The display panel further comprises a dielectric layer covering the above elements, a pixel electrode formed on the dielectric layer, an opposite substrate formed above the substrate and a non-emission display medium layer formed between the substrate and the opposite substrate. The pixel electrode is coupled to an electrode of the first switching element through the opening and is made of reflective material.

14 Claims, 5 Drawing Sheets

S602: providing an electronic device comprising a display panel with two display directions opposite to each other, wherein a pixel electrode, an opposite substrate and a non-emission display medium layer of the display panel form a reflective display element, and the display panel has a first display status and a second display status, the first display status employs a LED instead of the non-emission display medium layer to perform the display operation, and the second display status employs the non-emission display medium layer instead of the LED to perform the display operation S604: determining whether to supply the power source according to the ambient brightness of the electronic device, so as to switch the display statuses of the display panel

FIG. 6

DISPLAY PANEL WITH TWO DISPLAY DIRECTIONS OPPOSITE TO EACH OTHER, ELECTRONIC DEVICE AND METHOD FOR SWITCHING ELECTRONIC DEVICE

FIELD OF THE DISCLOSURE

This document relates to the display field, and more particularly to a display panel with two display directions opposite to each other, an electronic device, and a method for switching the electronic device.

BACKGROUND

Current folding mobile phone generally employs two independent display panels, one of the display panels is used as an inner screen of the mobile phone, and the other display panel is used as an outer screen of the mobile phone. Each of the two independent display panels comprises a pair of substrates and a liquid crystal layer sandwiched in between the pair of the substrates, and the liquid crystal layer does not emit light. Therefore, a user may obtain basic information such as current time and caller identification from the outer screen even if the user does not open the folding mobile phone.

However, since the current folding mobile phone employs two independent display panels, the cost of the mobile phone is high. Furthermore, the whole thickness of the mobile phone is high since each of the two independent display panels comprises two substrates. Thus, it will not satisfy the lightening and thinning trend.

SUMMARY OF THE DISCLOSURE

The present invention relates to a display panel with two display directions opposite to each other. A mobile phone using the display panel will have a lower cost and a thinner thickness.

The present invention relates to an electronic device, which adopts the display panel.

The present invention relates to a method for switching the electronic device.

The present invention provides a display panel with two display directions opposite to each other, which comprises a substrate, a first switching element, a second switching element, a light-emitting diode, a first dielectric layer, a pixel electrode, an opposite substrate and a non-emission display medium layer. The first switching element is formed on the substrate, and the first switching element has a first gate electrode, a first electrode and a second electrode. The first gate electrode is electrically coupled to a scan line and the first electrode is electrically coupled to a data line. The second switching element is formed on the substrate, and the second switching element has a second gate electrode, a third electrode and a fourth electrode. The third electrode is electrically coupled to a power source. The light-emitting diode is formed on the substrate, and the light-emitting diode has a fifth electrode, an emission layer and a reflective electrode. The fifth electrode is electrically coupled to the fourth electrode of the second switching element, the reflective electrode is electrically coupled to another power source, and the emission layer is sandwiched in between the fifth electrode and the reflective electrode and the emission layer is formed on the fifth electrode. The first dielectric layer covers the substrate, the first switching element, the second switching element and the light-emitting diode. The first dielectric layer has at least a first opening to expose a part of the second electrode of the first switching element. The pixel electrode formed on a part of the first dielectric layer and in the first opening, the pixel electrode is electrically coupled to the second electrode of the first switching element through the first opening, and the pixel electrode is made of reflective material. The opposite substrate is formed above the substrate, and the non-emission display medium layer is formed between the opposite substrate and the substrate.

In an exemplary embodiment of the present invention, the data line and the scan line intersect with each other to form at least one pixel region, and the first switching element, the second switching element and the light-emitting diode are all disposed in the pixel region.

In an exemplary embodiment of the present invention, the second electrode of the first switching element is electrically coupled to the gate electrode of the second switching element and the pixel electrode.

In an exemplary embodiment of the present invention, the display panel further comprises a touch element formed in the display panel.

In an exemplary embodiment of the present invention, the display panel further comprises a storage capacitor formed on the substrate. The storage capacitor has two capacitance electrodes. One of the two capacitance electrodes is electrically coupled to the power source or the said another power source, and the other capacitance electrode is electrically coupled to a node, wherein the node is located between the second electrode of the first switching element and the gate electrode of the second switching element.

In an exemplary embodiment of the present invention, the non-emission display medium layer is made of liquid crystal material, electrophoresis material, electrowetting material, or a combination thereof.

In an exemplary embodiment of the present invention, the display panel further comprises a color filter formed on an inner surface of the opposite substrate.

In an exemplary embodiment of the present invention, the display panel further comprises a transparent electrode formed below the color filter.

In an exemplary embodiment of the present invention, the display panel further comprises a color filter formed on the pixel electrode.

In an exemplary embodiment of the present invention, the display panel further comprises a transparent electrode formed on an inner surface of the opposite substrate.

In an exemplary embodiment of the present invention, a light-emitting current threshold of the light-emitting diode is substantially larger than an enabling current threshold of the second switching element.

The present invention also provides an electronic device, which comprises the display panel with the two display directions opposite to each other, a power-supplying circuit and a switching element. The power-supplying circuit is electrically coupled to the power source. The switching element is electrically coupled to the power-supplying circuit, and the switching element is configured for switching the display statuses of the display panel. When the switching element controls the power-supplying circuit to stop supplying the power source, the display panel is in a first status; when the switching element controls the power-supplying circuit to supply the power source, the display panel is in a second status. The first display status employs the light-emitting diode instead of the non-emission display medium layer to perform a display operation, and the second display status employs the non-emission display medium layer instead of the light-emitting diode to perform the display operation.

In an exemplary embodiment of the present invention, the electronic device further comprises a detecting element configured for detecting whether the display panel is in the first display status or in the second display status, so that the switching element switches the display statuses of the display panel.

The present invention further provides a method for switching the electronic device, which comprises the following steps: providing the electronic device having the display panel with the two display directions opposite to each other, wherein the pixel electrode, the opposite substrate and the non-emission display medium layer form a reflective display element, the display panel has a first display status and a second display status, the first display status employs the light-emitting diode instead of the non-emission display medium layer to perform a display operation, and the second display status employs the non-emission display medium layer instead of the light-emitting diode to perform the display operation; and determining whether to supply the power source according to ambient brightness of the electronic device, so as to switch the display statuses of the display panel.

The present invention employs a substrate, a first switching element, a second switching element, a light-emitting diode, a first dielectric layer, a pixel electrode, an opposite substrate and a non-emission display medium layer to form a display panel with two display directions opposite to each other. Instead of being manufactured by attaching two conventional independent display panels, the display panel of the present invention is manufactured by integrating the pixel circuits of the light-emitting diode and the non-emission display medium layer into a single panel, so that the cost of the display panel is lower, and the thickness thereof is thinner. Therefore, an electronic device adopting the display panel has a lower cost and a thinner thickness.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
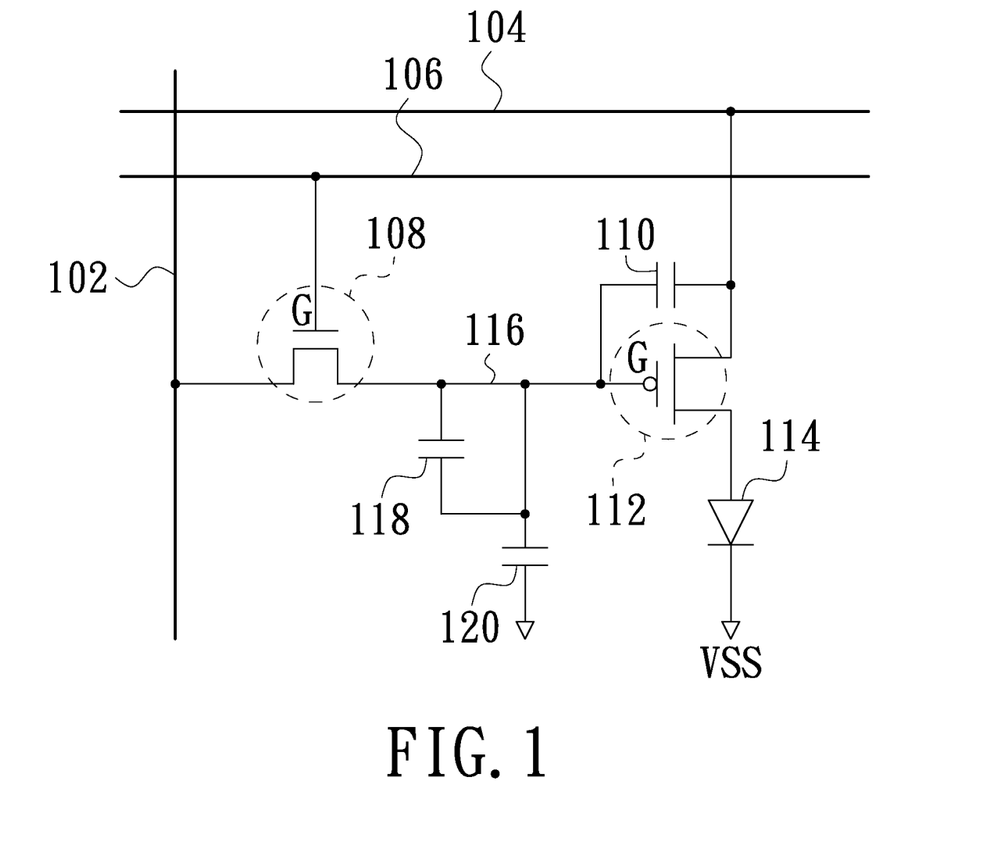
FIG. 1 is an equivalent circuit view of a pixel of a display panel with two display directions opposite to each other in accordance with an exemplary embodiment of the present invention.

FIG. 1 is an equivalent circuit view of a pixel of a display panel with two display directions opposite to each other in accordance with an exemplary embodiment of the present invention. Referring to FIG. 1, a data line 102 and a scan line 106 intersect with each other to form at least one pixel region. The pixel region comprises a pixel circuit of light-emitting diode (or namely light-emitting device, LED) and a reflective pixel circuit. The pixel circuit of LED includes a first switching element 108, a storage capacitor 110, a second switching element 112 and a LED 114. The reflective pixel circuit includes a reflective electrode 116 and a storage capacitor 118. The pixel circuit of LED is configured for performing a display operation towards a first direction, and the reflective pixel circuit is configured for performing another display operation towards a second direction opposite to the first direction. In other exemplary embodiments, the pixel region may selectively further comprise other capacitors according to a display media layer and a driving electric field of the reflective pixel circuit. For example, when the display media layer is a liquid crystal layer and the electric field for driving the liquid crystal layer is a vertical electric field, an additional capacitor (such as the liquid crystal capacitor 120) may exist therein. When the display media layer is a liquid crystal layer and the electric field for driving the liquid crystal layer is a horizontal electric field, an additional capacitor (such as the liquid crystal capacitor 120) may not exist therein or may exist therein. When the display media layer is made of other materials which will be described later and the driving electric field is a vertical or horizontal electric field, an additional capacitor (such as the liquid crystal capacitor 120) is selectively set or not set. In the exemplary embodiment, an additional capacitor (i.e., the liquid crystal capacitor 120) exist therein, however, the present invention is not limited herein.

As shown in FIG. 1, for the pixel circuit of LED, the first switching element 108 may be an N-type TFT (thin film transistor), and the second switching element 112 may be a P-type TFT. A gate electrode G and an electrode of the first switching element 108 are electrically coupled to the scan line 106 and the data line 102, respectively. A gate electrode G of the second switching element 112 is electrically coupled to the other electrode of the first switching element 108 and the pixel electrode 116. In addition, an electrode of the second switching element 112 is electrically coupled to a power line 104, so as to receive a power source (such as a power voltage VDD) through the power line 104. The other electrode of the second switching element 112 is electrically coupled to an electrode of the LED 114, and the other electrode of the LED 114 is electrically coupled to another power source (such as a power source VSS). Two capacitance electrodes of the storage capacitor 110 are electrically coupled to the power line 104 and the gate electrode G of the second switching element 112, respectively. In the exemplary embodiment, the power line 104 is substantially parallel to the scan line 106. In other exemplary embodiment, the power line 104 may be substantially parallel to the data line 102. It should be noted that a light-emitting current threshold of the LED 114 is substantially greater than an enabling current threshold of the second switching element 112. The exemplary embodiment employs an N-type TFT and a P-type TFT as an example. However, other exemplary embodiments may also employ two N-type TFTs or two P-type TFTs. In addition, various-type TFTs such as bottom-gate TFTs or top-gate TFTs may also be used.

Figure 2:
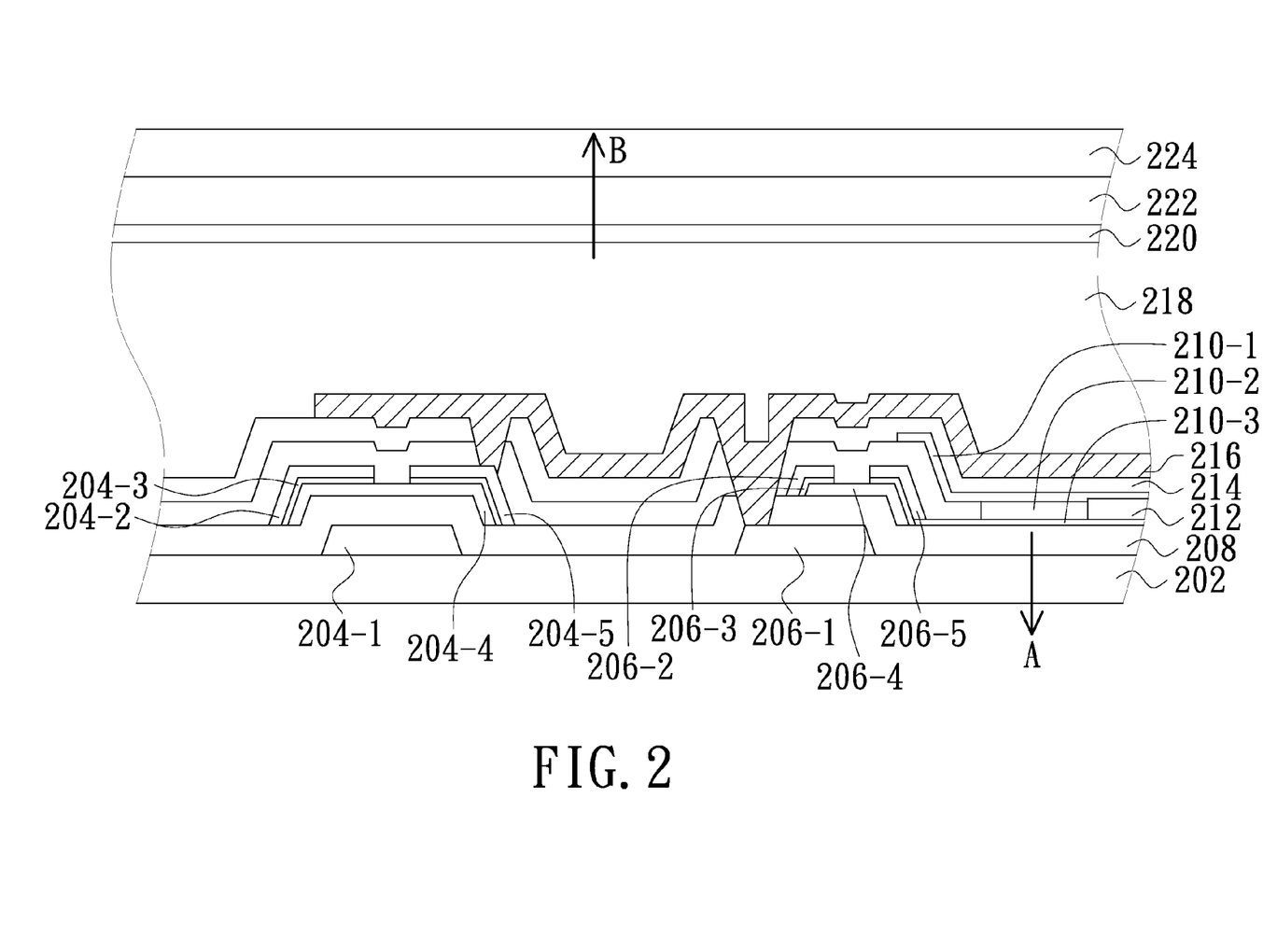
FIG. 2 is a cross-sectional view of a display panel with two display directions opposite to each other in accordance with an exemplary embodiment of the present invention.

FIG. 2 is a cross-sectional view of a display panel with two display directions opposite to each other in accordance with an exemplary embodiment of the present invention. In FIG. 2, a label 202 represents a substrate, and a label 208 represents a dielectric layer. In addition, a label 204-1 represents a gate electrode of the first switching element, a label 204-2 represents an electrode (also called as a first electrode) of the first switching element, a label 204-3 represents an ohmic contact layer of the first switching element, a label 204-4 represents a channel layer of the first switching element, and a label 204-5 represents the other electrode (also called as a second electrode) of the first switching element. The combination of the ohmic contact layer and the channel layer may be called as semiconductor layers. The semiconductor layers may be made of amorphous silicon (a-Si), poly-silicon, microcrystalline silicon (uC-Si), monocrystalline silicon, oxide semiconductor, organic silicon, organic oxide semiconductor, other suitable material, or a combination thereof. A label 206-1 represents a gate electrode of the second switching element, a label 206-2 represents an electrode (also called as a third electrode) of the second switching element, a label 206-3 represents an ohmic contact layer of the second switching element, a label 206-4 represents a channel layer of the second switching element. The combination of the ohmic contact layer and the channel layer may be called as semiconductor layers. The semiconductor layers may be made of amorphous silicon (a-Si), poly-silicon, microcrystalline silicon (uC-Si), monocrystalline silicon, oxide semiconductor, organic silicon, organic oxide semiconductor, other suitable material, or a combination thereof. A label 206-5 represents the other electrode (also called as a fourth electrode) of the second switching element. A label 210-1 represents a reflective electrode of the LED, a label 210-2 represents an emission layer of the LED, a label 210-3 represents an electrode (also called as a fifth electrode) of the LED. Labels 212 and 214 represent dielectric layers, a label 216 represents a pixel electrode, a label 218 represents a non-emission display medium layer, a label 220 represents a transparent electrode, a label 222 represents a color filter, and a label 224 represents an opposite substrate.

In FIG. 2, those below the pixel electrode 216 belong to the pixel of LED circuit configured for performing a display operation towards a direction A; the pixel electrode 216 and those above the pixel electrode 216 belong to the reflective pixel circuit configured for performing a display operation towards a direction B opposite to the direction A. The direction A and the direction B are in the same axis. For example, the two arrow directions of the Y axis shown in FIG. 2 are in the same axis. One of the two arrow directions is a positive axis direction (towards the substrate 224) and the other is a negative axis direction (towards the substrate 202). From FIG. 2, it can be seen that the first switching element, the second switching element and the LED are all formed on the substrate 202. In addition, the electrode 210-3 of the LED is electrically coupled to the electrode 206-5 of the second switching element, and the emission layer 210-2 of the LED is sandwiched in between the electrode 210-3 and the reflective electrode 210-1 and the emission layer 210-2 is disposed on the electrode 210-2. The reflective electrode 210-1 is configured for reflecting light to the direction A. In other words, a material of the electrode 210-3 includes transparent conductive material, for example: indium tin oxide (ITO), indium zinc oxide (IZO), aluminum zinc oxide (AZO), or other suitable materials, or the combination thereof. From FIG. 2, it can also be seen that the display panel of the present invention further comprises at least one dielectric layer covering the substrate 202, the first switching element, the second switching element, and the LED, and the dielectric layer has at least one opening (also called as a first opening) to expose a part of the electrode 204-5 of the first switching element. Thus, the pixel electrode 216 may be formed on a part of the dielectric layer and formed in the opening of the dielectric layer, so as to electrically couple to the electrode 204-5 of the first switching element via the opening. The pixel electrode 216 is made of reflective material to reflect ambient light, so that a part of the reflective pixel circuit performs the display operation towards the direction B. In addition, from FIG. 2 it can be seen that the opposite substrate 224 is formed above the substrate 202, and the non-emission display medium layer 218 is formed between the opposite substrate 224 and the substrate 202. Therefore, the display panel with the two display directions opposite to each other may employs only two substrates to perform the two display operations with the two display directions opposite to each other.

The non-emission display medium layer 218 may be made of liquid crystal material (such as liquid crystal material used in a horizontal electric filed, liquid crystal material used in a vertical electric field, blue-phase liquid crystal material, cholesteric liquid crystal material, other suitable material, or the combination thereof), electrophoresis material, electrowetting material, or a combination thereof, and the present invention is not limited herein. The emission layer of the LED may be made of inorganic material, organic material, other suitable material, or a combination thereof. In addition, in a high-end panel, the display panel as shown in FIG. 2 may further employ touch elements to form a touch panel. The touch elements may be formed in the display panel by the in-cell mode. For example, a sensitive layer is formed between the opposite substrate 224 and the non-emission display medium layer 218, so that the side of the non-emission display has a touch function or a sensitive layer is formed between the substrate 202 and the LED, so that the side of the emission display has a touch function. Certainly, the touch elements may also be attached on an outer surface of the opposite substrate 224 or the substrate 202, so that a user may directly touch the touch elements to perform a touch operation. In addition, although the color filter 222 is formed on an inner surface of the opposite substrate 222, and the transparent electrode 220 is formed below the color filter 222, the present invention is not limited herein. For example, the color filter 222 may be formed on the pixel electrode 216, and the transparent electrode 220 may be formed on the inner surface of the opposite substrate 224. In addition, the color filter 222 may be formed on the inner surface of the opposite substrate 224, and the transparent electrode 220 may be omitted. Furthermore, the color filter 222 may be formed on the pixel electrode 216, and the transparent electrode 220 may be omitted. In addition, another color filter (not shown) may be formed between the substrate 202 and LED.

Figure 3:
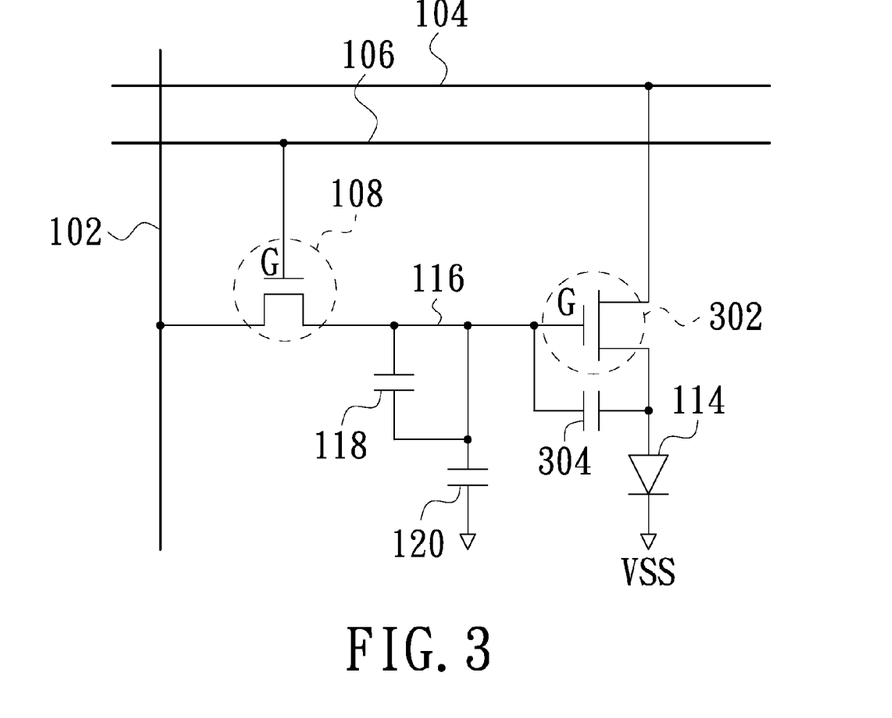
FIG. 3 is an equivalent circuit view of a pixel of a display panel with two display directions opposite to each other in accordance with another exemplary embodiment of the present invention.

FIG. 3 is an equivalent circuit view of a pixel of a display panel with two display directions opposite to each other in accordance with another exemplary embodiment of the present invention. In FIG. 3, labels same to those of FIG. 1 represent the same objects. The circuit of FIG. 3 is similar to that of FIG. 1 except that the second switching element 302 of the circuit of FIG. 3 is an N-type TFT, and a storage capacitor 304 is electrically coupled between the gate electrode G of the second switching element 302 and an electrode of the LED 114.

Figure 4:
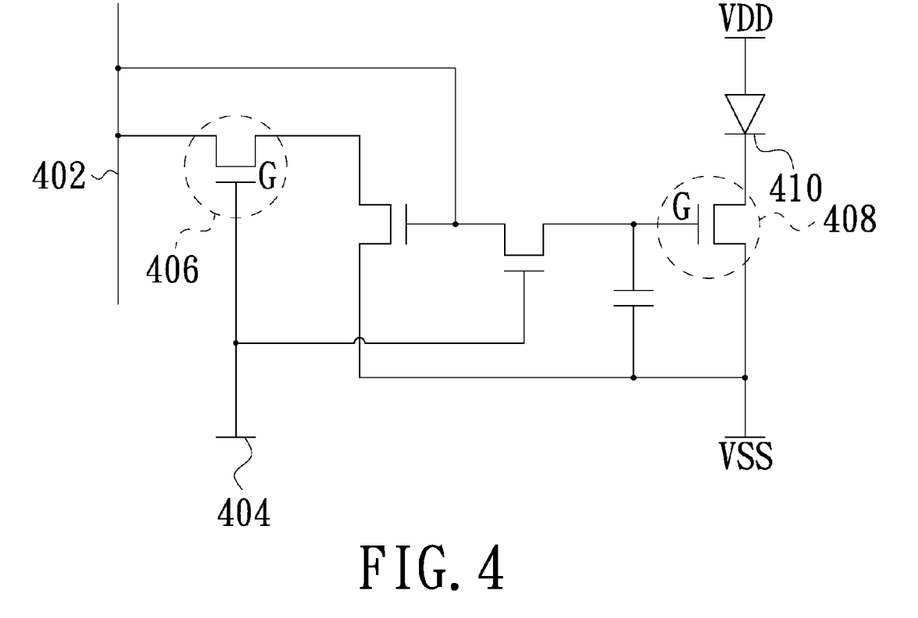
FIG. 4 is an equivalent circuit of a pixel circuit of light-emitting diode in accordance with an exemplary embodiment of the present invention.

Although the gate electrode of the second switching element is directly electrically coupled to one of the electrodes of the first switching element in the above exemplary embodiments, the gate electrode of the second switching element may be not directly electrically coupled to one of the electrodes of the first switching element in some pixel circuits of LED, which will be described by FIG. 4. FIG. 4 is an equivalent circuit of a pixel circuit of LED in accordance with an exemplary embodiment of the present invention. In FIG. 4, a label 402 represents a data line, a label 404 represents a scan line, a label 406 represents a first switching element, a label 408 represents a second switching element, and a label 410 represents a LED. As shown in FIG. 4, a gate electrode G of the second switching element 408 is electrically coupled to an electrode of the first switching element 406 through other elements. In addition, FIG. 4 also shows that the LED may be electrically coupled between a power voltage VDD and an electrode of the second switching element 408. The TFTs of the exemplary embodiment may be all N-type TFTs, but the present invention is not limited herein. According to design needs, the TFTs of the present invention may be all P-type TFTs. In addition, a part of the TFTs may be N-type TFTs, and the others may be P-type TFTs. Furthermore, the TFTs may be bottom-gate TFTs or top-gate TFTs.

Figure 5:
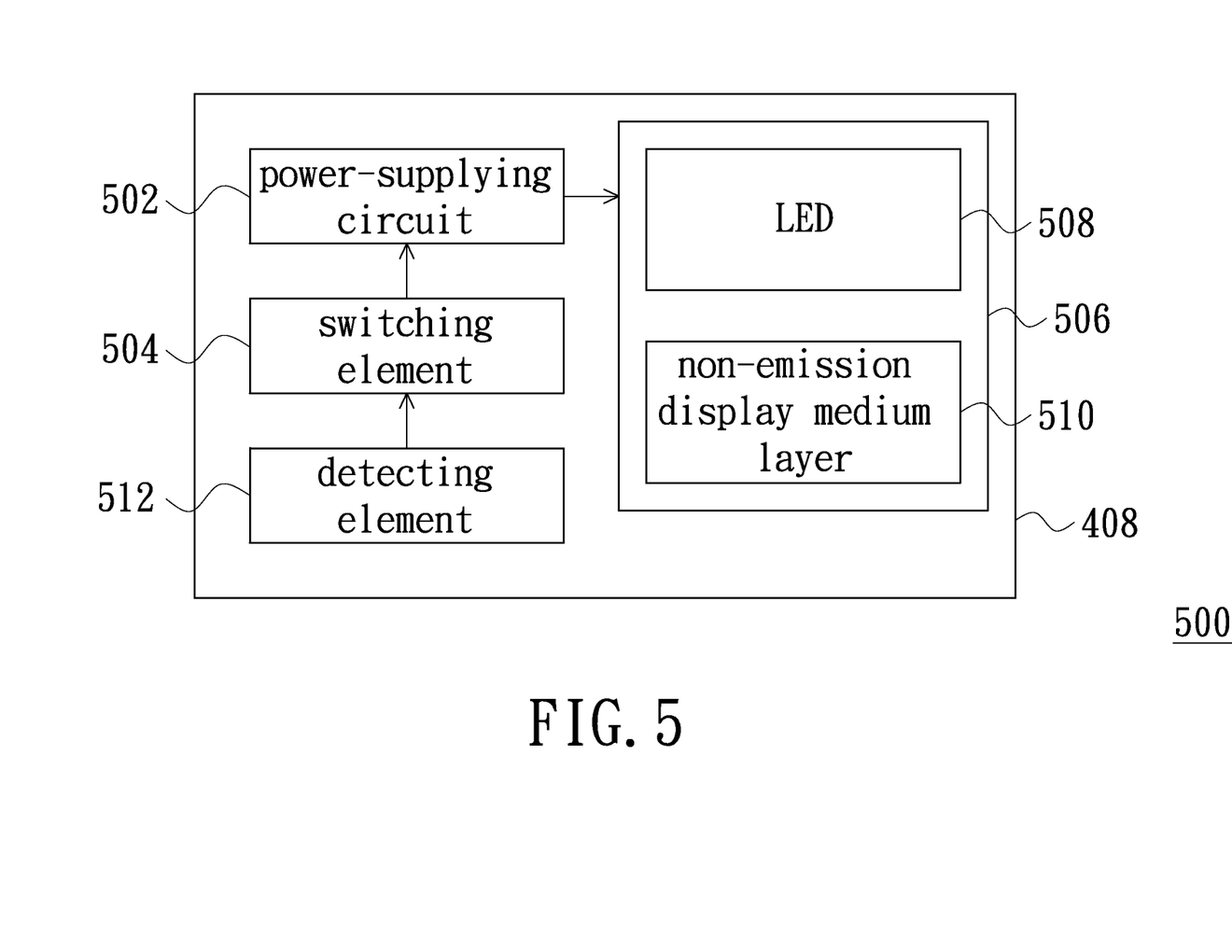
FIG. 5 is a block view of an electronic device in accordance with an exemplary embodiment of the present invention.

FIG. 5 is a block view of an electronic device in accordance with an exemplary embodiment of the present invention. Referring to FIG. 5, the electronic device 500 may be a folding mobile phone, but the present invention is not limited herein. For example, in some exemplary embodiments, the electronic device 500 may be a panel of a notebook computer, a panel of a portable device, an interactive panel, a large panel, etc. As shown in FIG. 5, the electronic device 500 comprises a power-supplying circuit 502, a switching element 504 and a display panel 506 with two display direction opposite to each other. The display panel 506 has two display elements: a LED 508 and a non-emission display medium layer 510. The power-supplying circuit 502 is electrically coupled to a power source in the display panel 506 (such as various power lines in the display panel 506). The switching element 504 is electrically coupled to the power-supplying circuit 502, and the switching element 504 is configured for switching the display status of the display panel 506. When the switching element 504 controls the power-supplying circuit 502 to stop supplying the power source, the display panel 506 is in a first display status; when the switching element 504 controls the power-supplying circuit 502 to supply the power source, the display panel 506 is in a second display status. The first display status employs the LED 508 instead of the non-emission display medium layer 510 to perform the display operation; the second display status employs the non-emission display medium layer 510 instead of the LED to perform the display operation. In other words, as the second switch device 112, 302, or 408 has potential difference exist in between the gate of the second switch device and the electrode of the second switching element 112, 302, or 408 so as to enable the LED 114 or 410, and as the second switch device 112, 302, or 408 has not any potential difference exist in between the gate of the second switch device and the electrode of the second switching element 112, 302, or 408 so as to disenable the LED 114 or 410.

The switching element 504 may be a mechanical element, an electric element or a combination thereof. For example, the switching element 504 may be a press key or other-type mechanical switching element, and it may be disposed in the electronic device 500 or a housing thereof, so that a user may directly switch the display statuses. Preferably, the electronic device 500 may further comprise a detecting element 512 configured for determining whether the display panel 506 is in the first display status or a second display status, so that the switching element 504 may switch the display statuses of the display panel 506. The detecting element 512 may be a photo sensor, a motion sensor, or a gravity sensor, and it may be disposed in the electronic device 500 or a housing thereof.

Figure 6:
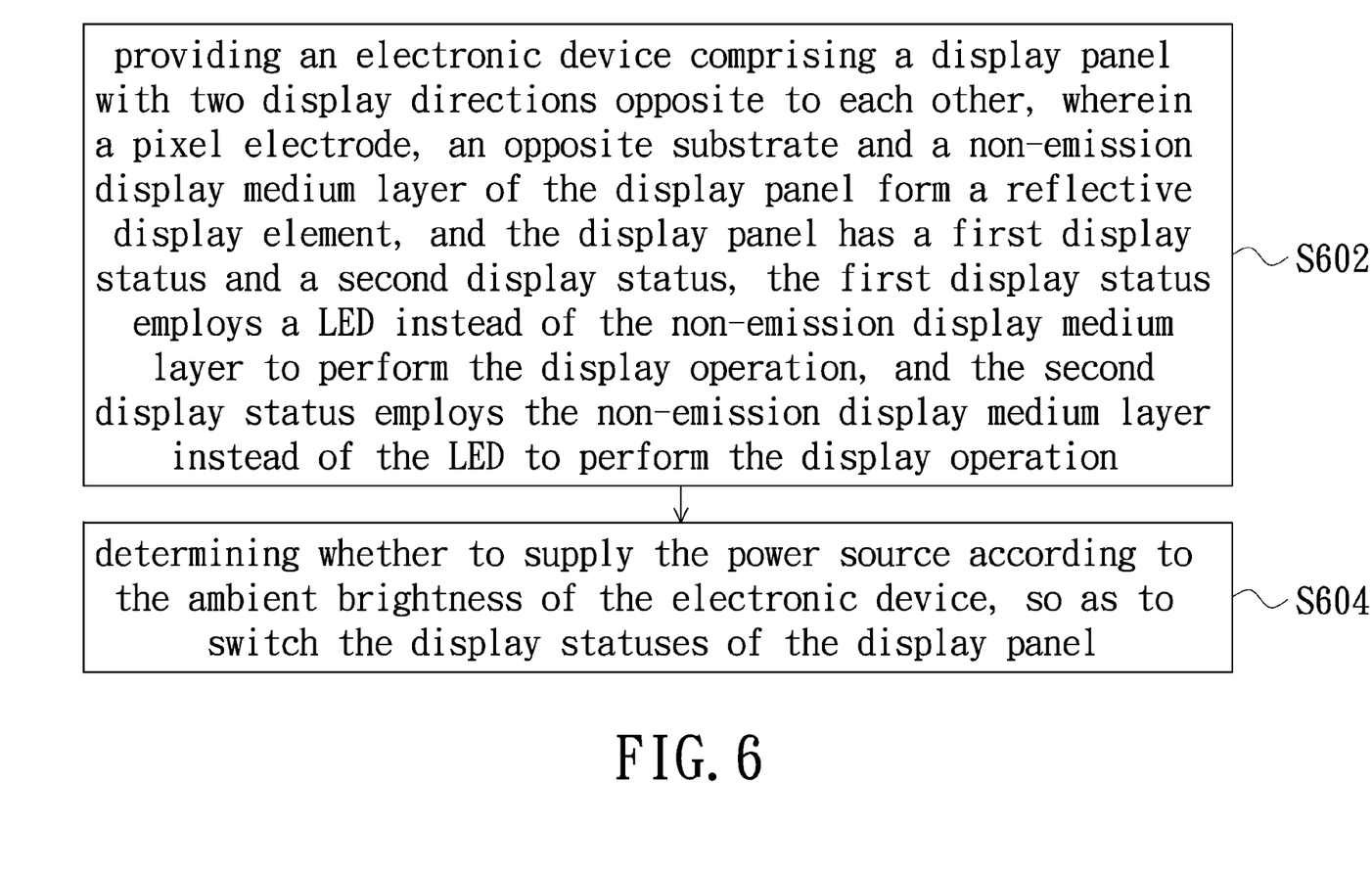
FIG. 6 is a flow chart of a method for switching an electronic device in accordance with an exemplary embodiment of the present invention.

FIG. 6 is a flow chart of a method for switching an electronic device in accordance with an exemplary embodiment of the present invention. Referring to FIG. 6, the method comprises the following steps: providing an electronic device comprising a display panel with two display directions opposite to each other, wherein a pixel electrode, an opposite substrate and a non-emission display medium layer of the display panel form a reflective display element, and the display panel has a first display status and a second display status, the first display status employs a LED instead of the non-emission display medium layer to perform the display operation, and the second display status employs the non-emission display medium layer instead of the LED to perform the display operation (as shown in a step S602); and determining whether to supply the power source according to the ambient brightness of the electronic device, so as to switch the display statuses of the display panel (as shown in a step S604). In other words, the ambient brightness means the brightness of the ambient light in outside of the electronic device or the electronic device in a light of some environment.

In summary, the present invention employs a substrate, a first switching element, a second switching element, a LED, a first dielectric layer, a pixel electrode, an opposite substrate and a non-emission display medium layer to form a display panel with two display directions opposite to each other. Instead of being manufactured by attaching two conventional display panels, the display panel of the present invention is manufactured by integrating LED pixel circuits and the non-emission display medium layer into a single panel, so that the cost of the display panel is lower, and the thickness thereof is thinner. Therefore, an electronic device adopting the display panel has a lower cost and a thinner thickness.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A display panel with two display directions opposite to each other, comprising:
   a substrate;
   a first switching element formed on the substrate, the first switching element having a first gate electrode, a first electrode and a second electrode, the first gate electrode being electrically coupled to a scan line and the first electrode being electrically coupled to a data line;
   a second switching element formed on the substrate, the second switching element having a second gate electrode, a third electrode and a fourth electrode, the third electrode being electrically coupled to a power source;
   a light-emitting diode formed on the substrate, the light-emitting diode having a fifth electrode, an emission layer and a reflective electrode, the fifth electrode being electrically coupled to the fourth electrode of the second switching element, the reflective electrode being electrically coupled to another power source, the emission layer being sandwiched in between the fifth electrode and the reflective electrode and the emission layer being formed on the fifth electrode;
   a first dielectric layer covering the substrate, the first switching element, the second switching element and the light-emitting diode, the first dielectric layer having at least a first opening to expose a part of the second electrode of the first switching element;

a pixel electrode formed on a part of the first dielectric layer and in the first opening, the pixel electrode being electrically coupled to the second electrode of the first switching element through the first opening, the pixel electrode being made of reflective material;

an opposite substrate formed above the substrate; and a non-emission display medium layer formed between the opposite substrate and the substrate.

2. The display panel according to claim 1, wherein the data line and the scan line intersect with each other to form at least one pixel region, and the first switching element, the second switching element and the light-emitting diode are all disposed in the pixel region.

3. The display panel according to claim 1, wherein the second electrode of the first switching element is electrically coupled to the gate electrode of the second switching element and the pixel electrode.

4. The display panel according to claim 1, further comprising:

a touch element formed in the display panel.

5. The display panel according to claim 1, further comprising:

a storage capacitor formed on the substrate, the storage capacitor having two capacitance electrodes, one of the two capacitance electrodes being electrically coupled to the power source or the said another power source, and the other capacitance electrode being electrically coupled to a node, wherein the node is located between the second electrode of the first switching element and the gate electrode of the second switching element.

6. The display panel according to claim 1, wherein the non-emission display medium layer is made of liquid crystal material, electrophoresis material, electrowetting material, or a combination thereof.

7. The display panel according to claim 1, further comprising:

a color filter formed on an inner surface of the opposite substrate.

8. The display panel according to claim 7, further comprising:

a transparent electrode formed below the color filter.

9. The display panel according to claim 1, further comprising:

a color filter formed on the pixel electrode.

10. The display panel according to claim 9, further comprising:

a transparent electrode formed on an inner surface of the opposite substrate.

11. The display panel according to claim 1, wherein a light-emitting current threshold of the light-emitting diode is substantially larger than an enabling current threshold of the second switching element.

12. An electronic device, comprising:

a display panel with two display directions opposite to each other according to claim 1;

a power-supplying circuit electrically coupled to the power source; and a switching element electrically coupled to the power-supplying circuit, the switching element being configured for switching the display statuses of the display panel, wherein when the switching element controls the power-supplying circuit to stop supplying the power source, the display panel is in a first status; when the switching element controls the power-supplying circuit to supply the power source, the display panel is in a second status, the first display status employs the light-emitting diode instead of the non-emission display medium layer to perform a display operation, and the second display status employs the non-emission display medium layer instead of the light-emitting diode to perform the display operation.

13. The electronic device according to claim 12, further comprising:

a detecting element configured for detecting whether the display panel is in the first display status or in the second display status, so that the switching element switches the display statuses of the display panel.

14. A method for switching an electronic device, comprising:

providing the electronic device according to claim 12, wherein the pixel electrode, the opposite substrate and the non-emission display medium layer form a reflective display element, the display panel has a first display status and a second display status, the first display status employs the light-emitting diode instead of the non-emission display medium layer to perform a display operation, and the second display status employs the non-emission display medium layer instead of the light-emitting diode to perform the display operation; and determining whether to supply the power source according to the ambient brightness of the electronic device, so as to switch the display statuses of the display panel.

* * * * *